(12) United States Patent
Song et al.

(10) Patent No.: US 9,165,619 B2
(45) Date of Patent: Oct. 20, 2015

(54) APPARATUS AND METHOD FOR READING DATA FROM MULTI-BANK MEMORY CIRCUITS

(71) Applicant: QUALCOMM Incorporated, San Diego, CA (US)

(72) Inventors: Hui Song, San Diego, CA (US); Sei Seung Yoon, San Diego, CA (US); Jongwon Lee, Beaverton, OR (US)

(73) Assignee: QUALCOMM Incorporated, San Diego, CA (US)

( * ) Notice: Subject to any disclaimer, the term of this patent is extended or adjusted under 35 U.S.C. 154(b) by 175 days.

(21) Appl. No.: 13/919,255

(22) Filed: Jun. 17, 2013

(65) Prior Publication Data
US 2014/0321217 A1    Oct. 30, 2014

Related U.S. Application Data

(60) Provisional application No. 61/817,767, filed on Apr. 30, 2013.

(51) Int. Cl.
*G11C 7/10* (2006.01)
*G11C 7/12* (2006.01)
*G11C 7/18* (2006.01)

(52) U.S. Cl.
CPC .. *G11C 7/12* (2013.01); *G11C 7/18* (2013.01); *G11C 7/1012* (2013.01); *G11C 2207/005* (2013.01)

(58) Field of Classification Search
USPC .......................... 365/189.02, 230.02, 230.03
See application file for complete search history.

(56) References Cited

U.S. PATENT DOCUMENTS

| | | | |
|---|---|---|---|
| 6,665,221 B2 | 12/2003 | Abedifard et al. | |
| 6,665,222 B2 | 12/2003 | Wright et al. | |
| 6,850,438 B2 | 2/2005 | Lee et al. | |
| 2009/0083479 A1 | 3/2009 | Lee et al. | |
| 2012/0137058 A1* | 5/2012 | Hanzawa | 711/103 |
| 2012/0317374 A1* | 12/2012 | Chen et al. | 711/154 |
| 2013/0117602 A1 | 5/2013 | Kim et al. | |

* cited by examiner

*Primary Examiner* — Vu Le
(74) *Attorney, Agent, or Firm* — Novak Druce Connolly Bove + Quigg LLP

(57) ABSTRACT

The disclosure relates to an apparatus for reading data from a memory circuit that includes at least two memory banks. The apparatus includes a first multiplexer configured to generate data at a first output from a first selected one of a first set of bit lines of a first memory bank based on a select signal. The apparatus also includes a second multiplexer configured to generate data at a second output from a second selected one of a second set of bit lines of a second memory bank based on the select signal. Additionally, the apparatus includes a gating device configured to gate the data from either the first and second multiplexer outputs based on an enable signal. And, the apparatus includes an interface circuit configured to produce the gated data on a global bit line.

39 Claims, 8 Drawing Sheets

APPARATUS AND METHOD FOR READING DATA FROM MULTI-BANK MEMORY CIRCUITS

CROSS-REFERENCE TO A RELATED APPLICATION

This application claims the benefit of the filing date of Provisional Application, Ser. No. 61/817,767, filed on Apr. 30, 2013, and entitled "System and Method for Reading Data from Multi-Bank Memory Circuits," which is incorporated herein by reference.

FIELD

The present disclosure relates to memory circuits, and in particular, to a local data path (LDP) circuit configured to output data from either a selected one of a first set of bit lines from a first memory bank or a selected one of a second set of bit lines from a second memory bank to a global bit line.

BACKGROUND

Many memory circuits are arranged in a plurality of memory banks. Typically, each of the memory banks comprises memory cells accessible by word lines and bit lines arranged in a two-dimensional rectangular or square array. Such memory circuits may include common bit lines, often referred to as global bit lines, selectively coupled to corresponding bit lines of the memory banks. A control circuit is typically provided in such memory circuits for receiving an input address associated with a selected memory cell to be accessed. Based on the input address, the control circuit selects the memory bank to which the selected memory cell pertains, selects the word line coupled to the memory cell, and causes the data in the selected memory cell to be outputted to a corresponding global bit line.

Typically, each memory bank includes a circuit, sometimes referred to a local data path (LDP), configured to transfer the data from the bit line associated with the selected memory cell to a corresponding global bit line. The speed on which that data is able to be transferred to the global bit line depends on the capacitive and resistive loading on the global bit line. If the memory circuit includes many memory banks, there may be many LDP circuits coupled to each global bit line. Each LDP circuit produces a capacitive and resistive load on the corresponding global bit line.

Accordingly, there is a need to reduce the capacitive and resistive loading of each global bit line in order to improve the speed on which data may be outputted by the memory circuit. Additionally, there is a further need to reduce the size of the integrated circuit area needed to implement all of the LDP circuits of a memory circuit.

SUMMARY

An aspect of the disclosure relates to an apparatus comprising a first multiplexer configured to generate data at a first output from a first selected one of a first set of bit lines of a first memory bank based on a select signal; a second multiplexer configured to generate data at a second output from a second selected one of a second set of bit lines of a second memory bank based on a second select signal; a gating device configured to output one of the data from the first and second outputs based on an enable signal; and an interface circuit configured to produce the data outputted by the gating device onto a global bit line.

In another aspect of the disclosure, the first multiplexer comprises a first set of switching elements for selectively coupling bit lines of the first set to the first output based on the select signal. In still another aspect, the switching elements of the first set comprise field effect transistors (FETs), and wherein gates of the FETs are configured to receive respective components of the select signal.

In another aspect of the disclosure, the second multiplexer comprises a second set of switching elements for selectively coupling bit lines of the second set to the second output based on the select signal. In still another aspect, the switching elements of the second set comprise field effect transistors (FETs), and wherein gates of the FETs are configured to receive respective components of the select signal.

In another aspect of the disclosure, the gating circuit is configured to gate the data from either the first and second multiplexer outputs in response to an asserted state of the enable signal; and generate a signal to configure the interface circuit to present a substantially high impedance to the global bit line in response to a de-asserted state of the enable signal.

In another aspect of the disclosure, the gating circuit comprises a first precharge circuit configured to precharge the first output of the first multiplexer to a high logic level voltage, wherein the high logic level voltage is discharged through the first selected one of the first set of bit lines in response to the data at the first selected one of the first set of bit lines being at a low logic level voltage; and a second precharge circuit configured to precharge the second output of the second multiplexer to a high logic level voltage, wherein the high logic level voltage is discharged through the second selected one of the second set of bit lines in response to the data at the second selected one being at a low logic level voltage.

In another aspect of the disclosure, the gating circuit comprises a logic gate including first and second inputs respectively coupled to the first and second outputs of the first and second multiplexers, wherein the logic gate comprises an output at which the gated data is generated in response to the enable signal. In still another aspect, the gating circuit further comprises a circuit for enabling the logic gate in response to the enable signal.

In another aspect of the disclosure, the enabling circuit comprises a first switching device configured to couple a first voltage rail to the logic gate in response to the enable signal being in an asserted state, and not couple the first voltage rail to the logic gate in response to the enable signal being in a de-asserted state; and a second switching device configured to couple the output of the logic gate to a second voltage rail in response to the enable signal being in the de-asserted state, and not couple the output of the logic gate to the second voltage rail in response to the enable signal being in the asserted state.

In another aspect of the disclosure, the gating circuit further comprises a circuit configured to couple the output of the logic gate to the interface circuit in response to an asserted state of the enable signal; and generate a signal to configure the interface circuit to present a substantially high impedance to the global bit line in response to a de-asserted state of the enable signal.

In another aspect of the disclosure, the data gated by the gating device is in inverted logic, wherein the global bit line is precharged to a high logic level voltage, and wherein the interface circuit comprises a switching device configured to discharge the global bit line in response to the inverted-logic data outputted by the gating device being at a high logic level voltage, and not discharge the global bit line in response to the inverted-logic data outputted by the gating device being at a low logic level voltage or the enable signal being in a de-asserted state.

In another aspect of the disclosure, the data gated by the gating device is in inverted logic, and wherein the interface circuit comprises an inverter configured to invert and output the inverted-logic data from the gating device to the global bit line. In still another aspect, the inverter is configured to present substantially high impedance to the global bit line in response to the enable signal being in a de-asserted state.

In another aspect of the disclosure, the apparatus further comprises a third multiplexer configured to generate data at a third output from a third selected one of a third set of bit lines of a third memory bank based on the select signal, a fourth multiplexer configured to generate data at a fourth output from a fourth selected one of a fourth set of bit lines of a fourth memory bank based on the select signal, and a second gating device configured to gate the data from either the third and fourth outputs based on a second enable signal, wherein the interface circuit is configured to produce the data gated by the second gating device on the global bit line.

Other aspect of the disclosure relates to apparatus, components, modules, devices, encoded computer-readable storage mediums, and other elements configured to achieve the operations in accordance with the aforementioned method. In general, other aspects, advantages and novel features of the present disclosure will become apparent from the following detailed description of the disclosure when considered in conjunction with the accompanying drawings.

The word "exemplary" is used herein to mean "serving as an example, instance, or illustration." Any aspect described herein as "exemplary" is not necessarily to be construed as preferred or advantageous over other aspects."

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Figure 1A:
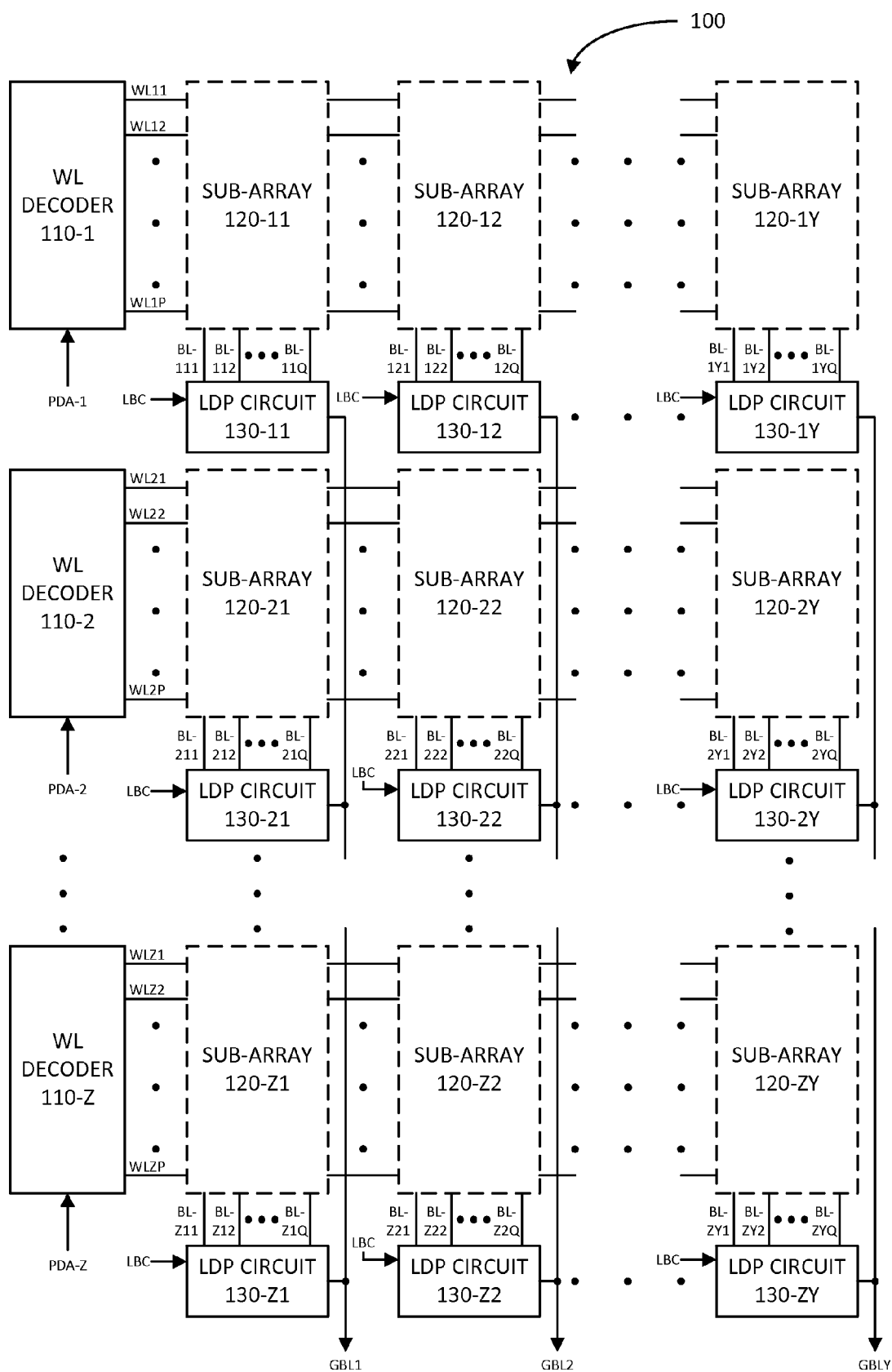
FIG. 1A illustrates a block diagram of an exemplary memory circuit that includes a plurality of memory banks in accordance with an aspect of the disclosure.

FIG. 1A illustrates a block diagram of an exemplary memory circuit 100 that includes a plurality of memory banks (e.g., Z number of memory banks). Each memory bank comprises a word line (WL) decoder coupled to a plurality of word lines. For instance, the first memory bank includes WL decoder 110-1 coupled to word lines WL11 to WL1P, the second memory bank includes WL decoder 110-2 coupled to word lines WL21 to WL2P, and the Zth memory bank includes WL decoder 110-Z coupled to word lines WLZ1 to WLZP.

Each memory bank also includes a plurality of sub-arrays sharing word lines associated with the corresponding WL decoder. For instance, the first memory bank includes sub-arrays 120-11 to 120-1Y sharing word lines WL11-WL1P associated with WL decoder 110-1, the second memory bank includes sub-arrays 120-21 to 120-2Y sharing word lines WL21-WL2P associated with WL decoder 110-2, and the Zth memory bank includes sub-arrays 120-Z1 to 120-ZY sharing word lines WLZ1-WLZP associated with WL decoder 110-Z.

Each memory bank further includes a plurality of local data path (LDP) circuits coupled to bit lines of corresponding sub-arrays. For instance, the first memory bank includes LDP circuits 130-11 to 130-1Y coupled to bit lines BL-111-BL11Q to BL-1Y1-BL-1YQ of sub-arrays 120-11 to 120-1Y, respectively. The second memory bank includes LDP circuits 130-21 to 130-2Y coupled to bit lines BL-211-BL-21Q to BL-2Y1-BL-2YQ of sub-arrays 120-21 to 120-2Y, respectively. And, the Zth memory bank includes LDP circuits 130-Z1 to 130-ZY coupled to bit lines BL-Z11-BL-Z1Q to BL-ZY1-BL-ZYQ of sub-arrays 120-Z1 to 120-ZY, respectively.

For accessing one or more memory cells, a controller (not shown) generates pre-decoded addresses PDA-1 to PDA-Z and local bank control (LBC) signals based on an input address. During a memory access operation, one of the PDA-1 to PDA-Z signals causes a corresponding WL decoder of a selected memory bank to activate a particular word line based on the input address. Also, during a memory access operation, the LBC signal causes the LDP circuits of the selected memory bank to output data, from memory cells coupled to the activated word line, via selected bit lines based on the LBC signal, and provide the data to corresponding global bit lines GBL1 to GBLY.

Figure 1B:
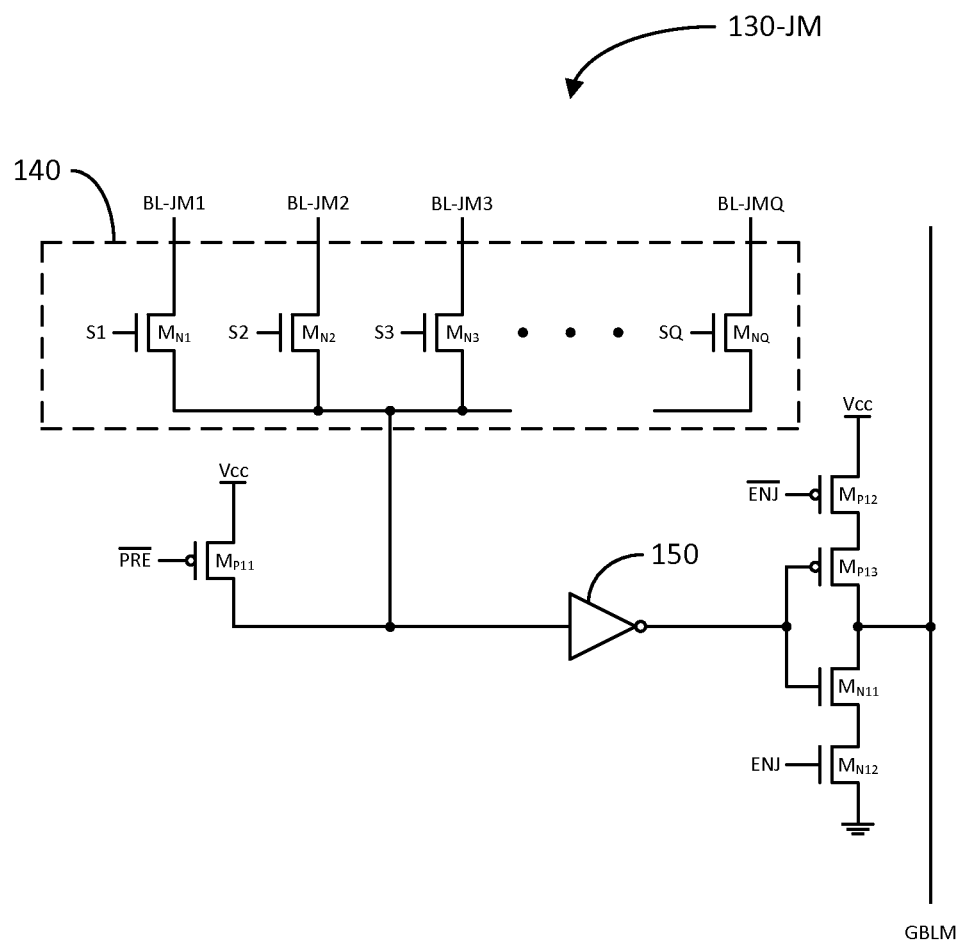
FIG. 1B illustrates a schematic diagram of an exemplary local data path (LDP) circuit in accordance with another aspect of the disclosure.

FIG. 1B illustrates a schematic diagram of an exemplary local data path (LDP) circuit 130-JM. In this example, the LDP circuit 130-JM is associated with the Jth memory bank and the Mth sub-array, as indicated by the suffix JM. The LDP circuit 130-JM includes a multiplexer 140 comprising n-channel field effect transistors (FETs) $M_{N1}$ to $M_{NQ}$ having sources coupled to respective bit lines BL-JM1 to BL-JMQ of the corresponding sub-array, gates configured to receive select components S1 to SQ of the LBC signal, and drains coupled together to serve as an output for the multiplexer 140. The LDP circuit 130-JM further includes a precharge circuit comprising a p-channel FET $M_{P11}$ including a source coupled to a positive voltage rail Vcc, a gate configured to receive a precharge signal $\overline{PRE}$, and a drain coupled to the output of the multiplexer 140.

The LDP circuit 130-JM further includes an inverter 150 including an input coupled to the output of the multiplexer 140 (as well as the drain of FET $M_{P11}$). The LDP circuit 130-JM circuit further includes a double-stacked inverter comprising inverting p- and n-channel FETs $M_{P13}$ and $M_{N11}$, and enabling p- and n-channel FETs $M_{P12}$ and $M_{N12}$. The inverting FETs $M_{P13}$ and $M_{N11}$ include gates coupled to an output of the inverter 150, drains coupled to a corresponding global bit line GBLM, and sources coupled respectively to drains of enabling FETs $M_{P12}$ and $M_{N12}$. The enabling FETs $M_{P12}$ and $M_{N12}$, in turn, include gates configured to respectively receive enabling components $\overline{ENJ}$ and ENJ of the LBC signal, and sources coupled to positive and negative voltage rails (e.g., Vcc and ground).

In operation, prior to a memory access or read operation, the precharge signal $\overline{PRE}$ is temporarily asserted (brought to a low logic level) in order to turn on FET $M_{P11}$. This is done to precharge the output of the multiplexer 140 to a high logic level voltage. Additionally, prior to a memory access operation, the select components S1 to SQ and the enable components $\overline{ENJ}$ and ENJ of the LBC signal are all de-asserted. With the select components S1 to SQ being de-asserted, the multiplexer 140 does not couple any bit lines BL-JM1 to BL-JMQ to the input of the inverter 150. With the enable components $\overline{ENJ}$ and ENJ being de-asserted, the enabling FETs $M_{P12}$ and $M_{N12}$ are turned off. Thus, there is substantially no current path between the output node (the drains of FETs $M_{P13}$ and $M_{N11}$) and the positive and negative voltage rails (e.g, Vcc and ground). Thus, the output node is configured to float or present substantially high impedance to the global bit lines GBLM.

During a memory access or read operation, a controller (not shown) generates an LBC signal for selecting the appropriate bit lines coupled to the memory cells from which data is be outputted to global bit lines. With regard to LDP circuit 130-JM, one of the select components S1 to SQ is asserted to couple the selected bit line to the input of the inverter 150. Additionally, the enabling components $\overline{ENJ}$ and ENJ are asserted to turn on enabling FETs $M_{P12}$ and $M_{N12}$.

If the data read from the selected bit line is at a high logic level voltage, the precharged high logic level voltage at the input of the inverter 150 remains substantially unchanged. In response, the inverter 150 generates a low logic level voltage at its output. The inverting FETs (FETs $M_{P13}$ and $M_{N11}$) invert the low logic level voltage to produce a high logic level voltage on the global bit line GBLM. If, on the other hand, the data read from the selected bit line is at a low logic level voltage, the precharged high logic level voltage is discharged through the selected bit line to produce a low logic level voltage at the input of the inverter 150. In response, the inverter 150 generates a high logic level voltage at its output. The inverting FETs (FETs $M_{P13}$ and $M_{N11}$) invert the high logic level voltage to produce a low logic level voltage on the global bit line GBLM.

An issue associated with the memory circuit 100 is the capacitive and resistive loading of the global bit lines due to the number and implementation of LDP circuits connected to the global bit lines. For instance, with reference to FIG. 1A, each global bit line is coupled to Z number of LDP circuits or the number of memory banks in the memory circuit 100. Thus, the capacitive loading $C_{GBL}$ on each global bitline is $C_{LDP} \times Z$, where $C_{LDP}$ is the effective capacitance at the output node of each LDP circuit. Additionally, with reference to FIG. 1B, the effective capacitance $C_{LDP}$ at the output node of each LDP circuit is substantially the sum of the drain capacitance of FETs $M_{P13}$ and $M_{N11}$. Further, the resistive loading of the global bit line by each LDP circuits is related to the resistances or sizes of all of the devices $M_{P12}$, $M_{P13}$, $M_{N11}$, and $M_{N12}$. Such significant capacitive and resistive loading on global bit lines substantially reduces the speed in which data may be put on the global bit lines.

Another related issue is the large amount of integrated circuit or chip area needed to implement all of those LDP circuits. Thus, there is a need for a new implementation and technique to reduce the capacitive and resistive loading of global bit lines, as well as save integrated circuit or chip area.

Figure 2:
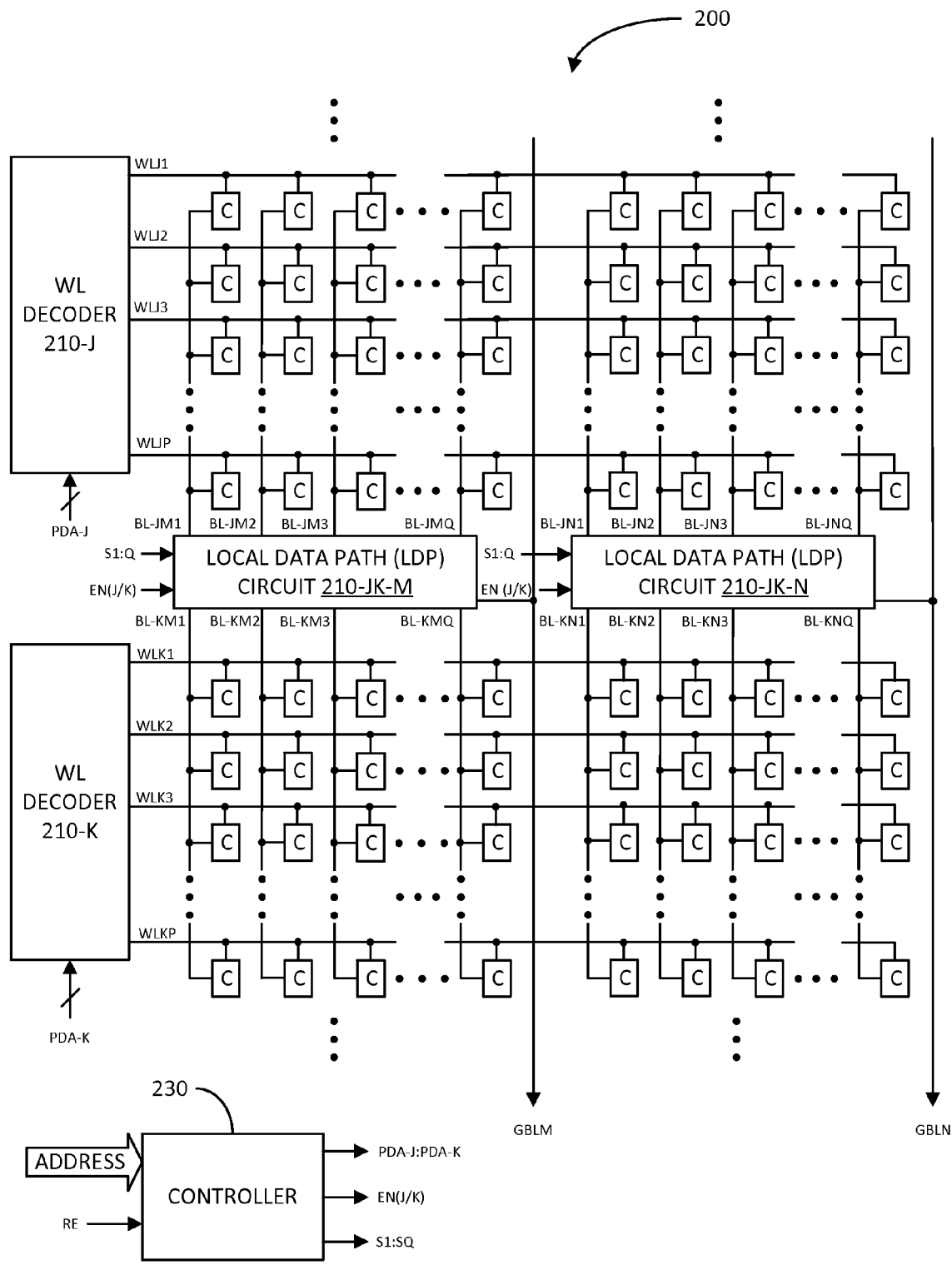
FIG. 2 illustrates a block diagram of an exemplary memory circuit in accordance with an aspect of the disclosure.

FIG. 2 illustrates a block diagram of an exemplary memory circuit 200 in accordance with an aspect of the disclosure. In summary, the memory circuit 200 includes a local data path (LDP) circuit that serves a pair of sub-arrays of distinct memory banks. Thus, by having one LDP circuit serve a pair of sub-arrays instead of a single sub-array, the number of LDP circuits coupled to a global bit line may be reduced by as much as one-half Additionally, as discussed with reference to FIGS. 3-5, each LDP circuit is designed to reduce the capacitance and resistive loading on the corresponding global bit line. Accordingly, since there are fewer LDP circuits required to implement the same functionality, substantial savings in integrated circuit or chip area may result.

In particular, the memory circuit 200 comprises a first memory bank including word line (WL) decoder 210-J coupled to word lines WLJ1 to WLJP. The first memory bank further comprises a first sub-array of memory cells C arranged in rows and columns. Memory cells C along rows of the first sub-array are coupled to word lines WLJ1 to WLJP, respectively. Memory cells C along columns of the first sub-array are coupled to bit lines BL-JM1 to BL-JMQ, respectively. The bit lines BL-JM1 to BL-JMQ associated with the first sub-array are coupled to a local data path (LDP) circuit 210-JK-M.

Additionally, the first memory bank comprises a second sub-array of memory cells C arranged in rows and columns. Memory cells C along rows of the second sub-array are coupled to word lines WLJ1 to WLJP, respectively. Memory cells C along columns of the second sub-array are coupled to bit lines BL-JN1 to BL-JNQ, respectively. The bit lines BL-JN1 to BL-JNQ associated with the second sub-array are coupled to LDP circuit 210-JK-N.

The memory circuit 200 further comprises a second memory bank including word line (WL) decoder 210-K coupled to word lines WLK1 to WLKP. The second memory bank also comprises a third sub-array of memory cells C arranged in rows and columns. Memory cells C along rows of the third sub-array are coupled to word lines WLK1 to WLKP, respectively. Memory cells C along columns of the third sub-array are coupled to bit lines BL-KM1 to BL-KMQ, respectively. The bit lines BL-KM1 to BL-KMQ associated with the third sub-array are coupled to LDP circuit 210-JK-M.

Additionally, the second memory bank comprises a fourth sub-array of memory cells C arranged in rows and columns. Memory cells C along rows of the fourth sub-array are coupled to word lines WLK1 to WLKP, respectively. Memory cells C along columns of the fourth sub-array are coupled to bit lines BL-KN1 to BL-KNQ, respectively. The bit lines BL-KN1 to BL-KNQ associated with the fourth sub-array are coupled to LDP circuit 210-JK-N.

Although, in this example, the memory circuit 200 comprises two memory banks, each including two sub-arrays, it shall be understood that the memory circuit 200 may comprise more than two memory banks, and each memory bank may comprises more or less than two sub-arrays.

The memory circuit 200 further comprises a controller 230 configured to generate predecoded address signals PDA-J and PDA-K, and local bank control (LBC) signals S1:SQ and EN(J/K) based on an input address and in response to a read enable (RE) signal. More specifically, if the input address dictates that memory cells C in the first and second sub-arrays of the first memory bank are to be accessed for a read operation, the controller 230 configures the predecoded address signal PDA-J to cause the WL decoder 210-J to activate one of the word lines WLJ1 to WLJP coupled to the memory cells to be accessed. In addition, the controller 230 asserts one of the select components S1:Q and the enable component EN(J/K) to cause the LDP circuits 210-JK-M and 210-JK-N to output the data from the selected bit lines BL-JM1 to BL-JMQ and BL-JN1 to BL-JNQ to global bit lines GBLM and GBLN, respectively.

In the case where memory cells in the first memory bank are accessed, the controller 230 may configure the pre-decoded address PDA-K to not assert any word lines WLK1-WLKP, so that data is not read from memory cells in the second memory bank. Although the select component S1:Q of the LBC signal are common to both memory banks, data will not be outputted from the unselected memory bank because no word lines are asserted therein.

Similarly, if, on the other hand, the input address dictates that memory cells C in the second memory bank are to be accessed for a read operation, the controller 230 configures the predecoded address signal PDA-K to cause the WL decoder 210-K to activate one of the word lines WLK1 to WLKP coupled to the memory cells to be accessed. In addition, the controller 230 asserts one of the select components S1:Q and the enable component EN(J/K) to cause the LDP circuits 210-JK-M and 210-JK-N to output the data from the selected bit lines BL-KM1 to BL-KMQ and BL-KN1 to BL-KNQ to global bit lines GBLM and GBLN, respectively.

In a similar manner, in the case where memory cells in the second memory bank are accessed, the controller 230 may configure the pre-decoded address PDA-J to not assert any word lines WLJ1-WLJP, so that data is not read from memory cells in the second memory bank. As previously discussed, although the select component S1:Q of the LBC signal are common to both memory banks, data will not be outputted from the unselected memory bank because no word lines are asserted therein.

Thus, the memory circuit 200 uses a single LDP circuit for outputting data from different memory banks to a global bit line. By employing this technique, the number of LDP circuits coupled to a global bit line may be reduced by 100 percent. Thus, the capacitive and resistive loading on a global bit line may likewise be reduced by 100 percent, or more as further discussed below with reference to specific embodiments of LDP circuits. The substantial reduction in the capacitive and resistive loading on a global bit line allows the speed to which data is provided to global bit lines to be substantially increased. Additionally, since substantially fewer LDP circuits are required in memory circuit 200 to perform the same operation as in memory circuit 100, there may be a substantial reduction in integrated circuit or chip area required to implement the memory circuit 200.

Figure 3:
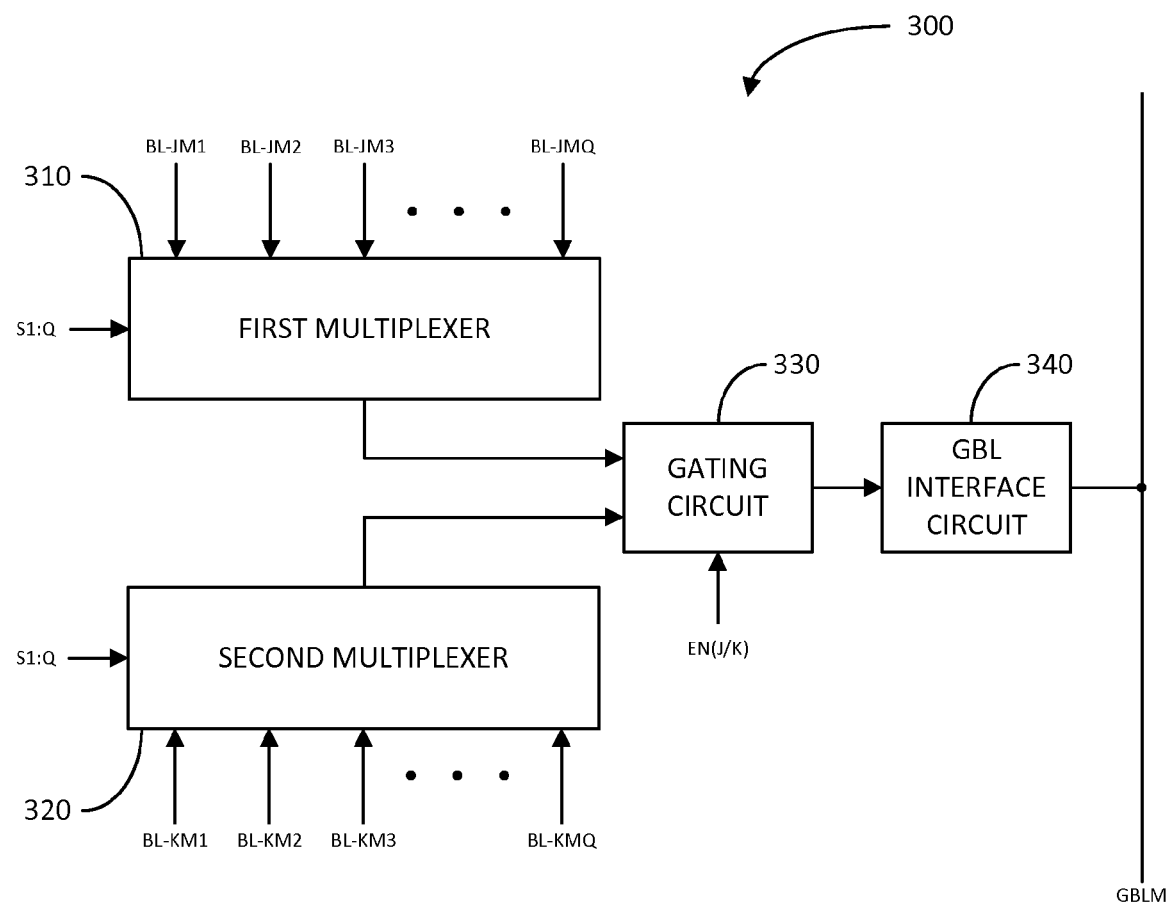
FIG. 3 illustrates a block diagram of another exemplary local data path (LDP) circuit in accordance with another aspect of the disclosure.

FIG. 3 illustrates a block diagram of an exemplary local data path (LDP) circuit 300 in accordance with another aspect of the disclosure. The LDP circuit 300 may be one example of a detailed implementation of any of the LDP circuits 210-JK-M and 210-JK-N, previously discussed. For ease of explanation, the LDP circuit 300 is described as performing the operation of LDP circuit 210-JK-M described above.

More specifically, the LDP circuit 300 comprises a first multiplexer 310, a second multiplexer 320, a gating circuit 330, and a global bit line (GBL) interface circuit 340. The first multiplexer 310 comprises inputs coupled to bit lines BL-JM1 to BL-JMQ associated with a sub-array of a first memory bank. The first multiplexer 310 further comprises a select input configured to receive select signal S1:Q. The first multiplexer 310 couples one of the bit lines BL-JM1 to BL-JMQ to an output of the first multiplexer 310 based on the select signal SJ1:Q.

Similarly, the second multiplexer 320 comprises inputs coupled to bit lines BL-KM1 to BL-KMQ associated with a sub-array of a second memory bank. The second multiplexer 320 further comprises a select input configured to receive select signal S1:Q. The second multiplexer 320 couples one of the bit lines BL-KM1 to BL-KMQ to an output of the second multiplexer 320 based on the select signal S1:Q.

The gating circuit 330 comprises inputs coupled to the outputs of the first and second multiplexers 310 and 320, respectively. The gating circuit 330 also includes an input configured to receive an enable signal EN(J/K). In response to the enable signal EN(J/K) being asserted, the gating circuit 330 gates to its output the data present at either output of the first and second multiplexers 310 and 320. The GBL interface circuit 340 puts the gated data from the gating circuit 330 on the global bit line GBLM. In response to the enable signal EN(J/K) being de-asserted, the gating circuit 330 generates a signal that configures the GBL interface circuit 340 to substantially float its output node, i.e., the node coupling the GBL interface circuit 340 to the global bit line GBLM. In this way, the floating output node presents substantially high impedance to the global bit line GBLM to prevent interference of the global bit line GBLM by the LDP 300, when other LDP circuits associated with other memory banks are using the global bit line GBLM.

In operation, if a memory cell in the sub-array of the first memory bank is to be accessed, the select signal S1:Q is configured to cause the first multiplexer 310 to couple one of the bit lines BL-JM1 to BL-JMQ to which the selected memory cell is coupled, to the output of the first multiplexer 310. The data on the selected bit line is then transferred to the output of the first multiplexer 310, and consequently, to an input of the gating circuit 330. Although the select signal S1:Q also causes the second multiplexer 320 to couple a corresponding one of the bit lines BL-KM1 to BL-KMQ to its output, since no word lines in the second memory bank are asserted, no data is transferred to the output of the second multiplexer 320. The enable signal EN(J/K) is also asserted to cause the gating circuit 330 to gate the data from the output of the first multiplexer 310 to the input of the global bit line GBL interface circuit 340. The GBL interface circuit 340 then puts the gated data on the global bit line GBLM.

Similarly, if a memory cell in the sub-array of the second memory bank is to be accessed, the select signal S1:Q is configured to cause the second multiplexer 320 to couple one of the bit lines BL-KM1 to BL-KMQ to which the selected memory cell is coupled, to the output of the second multiplexer 320. The data on the selected bit line is then transferred to the output of the second multiplexer 320, and consequently, to an input of the gating circuit 330. Although the select signal S1:Q also causes the first multiplexer 310 to couple a corresponding one of the bit lines BL-JM1 to BL-JMQ to its output, since no word lines in the first memory bank are asserted, no data is transferred to the output of the first multiplexer 310. The enable signal EN(J/K) is also asserted to cause the gating circuit 330 to gate the data from the output of the second multiplexer 320 to the input of the GBL interface circuit 340. The GBL interface circuit 340 then puts the gated data on the global bit line GBLM.

As discussed in more detail below with regard to more exemplary detailed implementations of LDP circuits, the placing of the enable operation of the LDP circuit 300 at the gating circuit 330 instead of the GBL interface circuit 340 allows the GBL interface circuit 340 to be implemented with fewer devices. This facilitates the reduction of the capacitive and resistive loading of each LDP circuit on a global bit line. Again, the reduction of the capacitive and resistive loading on a global bit line improves the speed to which data may be put on global bit lines.

Figure 4:
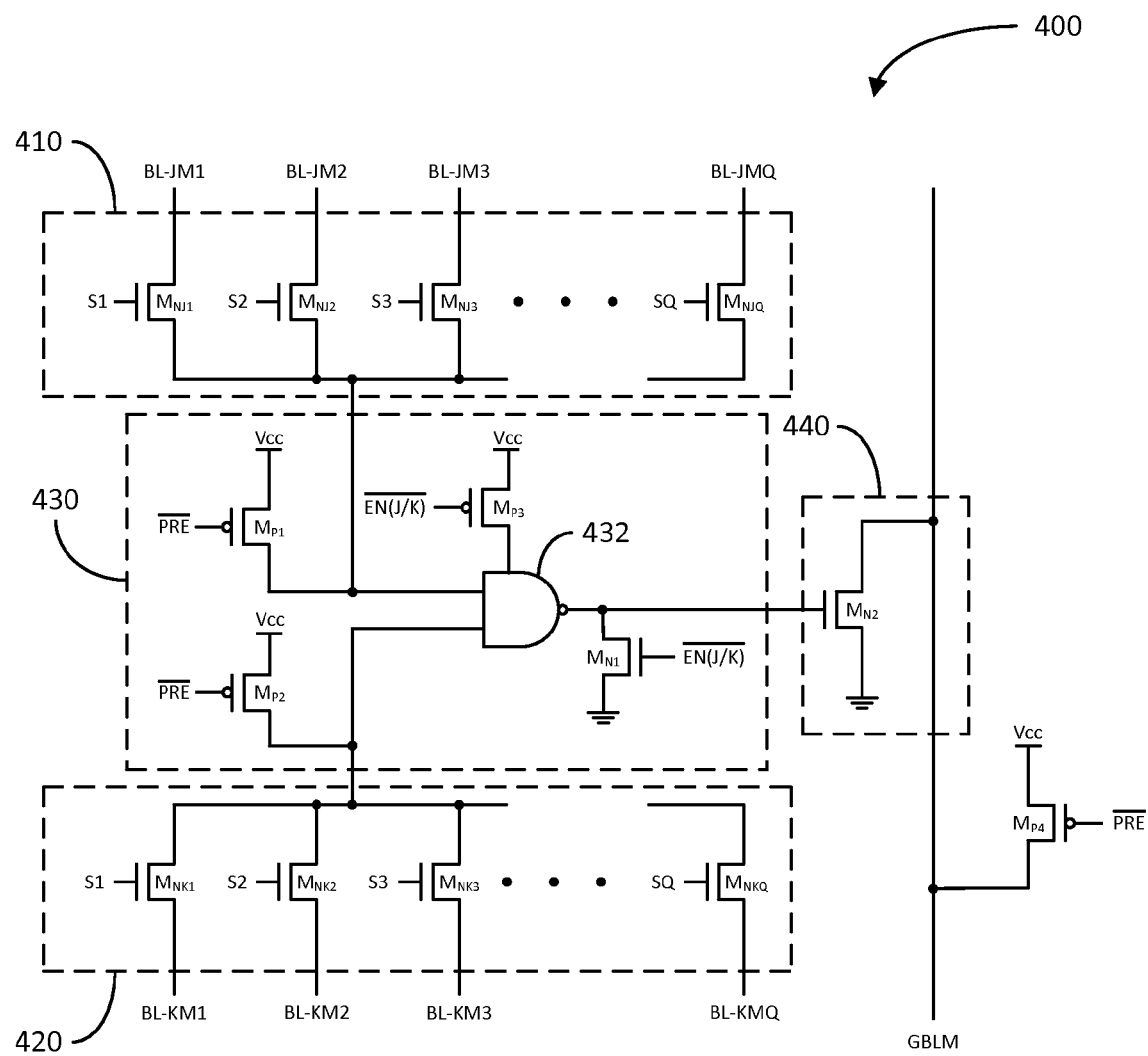
FIG. 4 illustrates a schematic diagram of another exemplary local data path (LDP) circuit in accordance with another aspect of the disclosure.

FIG. 4 illustrates a schematic diagram of an exemplary local data path (LDP) circuit 400 in accordance with another aspect of the disclosure. The LDP circuit 400 may be one exemplary detailed implementation of LDP 300 previously discussed. In particular, the LDP circuit 400 comprises a first multiplexer 410, a second multiplexer 420, a gating circuit 430, and a GBL interface circuit 440.

The first multiplexer 410 comprises a plurality of switching elements $M_{NJ1}$ to $M_{NJQ}$. In this example, the switching elements $M_{NJ1}$ to $M_{NJQ}$ are configured as n-channel field effect transistors (FETs). However, it shall be understood that the switching elements $M_{NJ1}$ to $M_{NJQ}$ may be configured as other types of devices, such as p-channel FETs, bipolar devices, transmission gates, and others. The FETs $M_{NJ1}$ to $M_{NJQ}$ include sources coupled respectively to the bit lines BL-JM1 to BL-JMQ of a sub-array in a first memory bank, gates configured to respectively receive select signals S1 to SQ, and drains coupled together to form an output of the first multiplexer 410.

Similarly, the second multiplexer 420 comprises a plurality of switching elements $M_{NK1}$ to $M_{NKQ}$. In this example, the switching elements $M_{NK1}$ to $M_{NKQ}$ are also configured as n-channel FETs. However, it shall be understood that the switching elements $M_{NK1}$ to $M_{NKQ}$ may be configured as other types of devices, such as p-channel FETs, bipolar devices, transmission gates, and others. The FETs $M_{NK1}$ to $M_{NKQ}$ include sources coupled respectively to the bit lines BL-KM1 to BL-KMQ of a sub-array in a second memory bank, gates configured to respectively receive select signals S1 to SQ, and drains coupled together to form an output of the second multiplexer 420.

The gating circuit 430 comprises a first precharge circuit including switching device $M_{P1}$ responsive to a precharge signal $\overline{PRE}$. In this example, the switching device $M_{P1}$ is configured as a p-channel FET comprising a source coupled to a positive voltage rail Vcc, a gate configured to receive the precharge signal $\overline{PRE}$, and a drain coupled to the output of the first multiplexer 410. It shall be understood that the switching device $M_{P1}$ may be configured as other types of devices. The gating circuit 430 further comprises a second precharge circuit including switching device $M_{P2}$ responsive to the precharge signal $\overline{PRE}$. In this example, the switching device $M_{P2}$ is also configured as a p-channel FET comprising a source coupled to the positive voltage rail Vcc, a gate configured to receive the precharge signal $\overline{PRE}$, and a drain coupled to the output of the second multiplexer 420. It shall be understood that the switching device $M_{P2}$ may be configured as other types of devices.

The gating circuit 430 further comprises a logic gate 432 including inputs coupled to the outputs of the first and second multiplexers 410 and 420, respectively. In this example, the logic gate 432 is configured as a NAND gate. However, it shall be understood that the logic gate 432 may be configured as other types of logic devices. The gating circuit 430 further comprises an enabling circuit including switching devices $M_{P3}$ and $M_{N1}$. In this example, the switching devices $M_{P3}$ and $M_{N1}$ are configured as p-channel and n-channel FETs, respectively. However, it shall be understood that the switching devices $M_{P3}$ and $M_{N1}$ may be configured as other types of devices. The FET $M_{P3}$ comprises a source coupled to the positive voltage rail Vcc, a gate configured to receive enable signal $\overline{ENJ/K}$, and a drain coupled to a biasing input of the NAND gate 432. The FET $M_{N1}$ comprises a drain coupled to the output of the NAND gate 432, a gate configured to receive the enable signal $\overline{ENJ/K}$, and a source coupled to a negative voltage rail (e.g., ground).

The GBL interface circuit 440 comprises a switching device $M_{N2}$. In this example, the switching device $M_{N2}$ is configured as an n-channel FET. However, it shall be understood that the switching device $M_{N2}$ may be configured as other types of switching devices. The FET $M_{N2}$ comprises a drain coupled to a global bit line GBLM, a gate coupled to the output of the NAND gate 432, and a source coupled to ground. Although not part of the LDP circuit 400, a precharge circuit comprising a switching device $M_{P4}$ may be provided to precharge the global bit line GBLM to a high logic level voltage. In this example, the switching device $M_{P4}$ may be configured as a p-channel FET. However, it shall be understood that the switching device $M_{P4}$ may be configured as other types of switching devices. The FET $M_{P4}$ comprises a source coupled to the positive voltage rail Vcc, a gate configured to receive the precharge signal $\overline{PRE}$, and a drain coupled to the global bit line GBLM.

In operation, prior to a memory access operation, the precharge signal $\overline{PRE}$ is temporarily asserted (e.g., brought to a low logic level) to precharge the outputs of the first and second multiplexers 410 and 420, and the global bit line to a high logic level voltage. More specifically, the asserted precharge signal $\overline{PRE}$ causes FETs $M_{P1}$, $M_{P2}$, and $M_{P4}$ to conduct, thereby coupling the positive voltage rail Vcc to the outputs of the first and second multiplexers 410 and 420, and to the global bit line GBLM, respectively. Once the voltages at the outputs of the first and second multiplexers 410 and 420 and the global bit line GBLM reach the high logic level voltage the precharge signal $\overline{PRE}$ may be de-asserted to turn off FETs $M_{P1}$, $M_{P2}$, and $M_N$.

Also, prior to a memory access operation, the select signal S1-SQ are all in a de-asserted state to de-couple the bit lines BL-JM1-BL-JMQ and BL-KM1-BL-KMQ from the outputs of the first and second multiplexers 410 and 420. Additionally, the enable signal $\overline{ENJ/K}$ is in a de-asserted state to de-couple the positive voltage rail Vcc from the NAND gate 432 using FET $M_{P3}$, thereby rendering the NAND gate 432 inoperable; and to couple the output of the NAND gate 432 to ground via FET $M_{N1}$. The grounding of the output of the NAND gate 432, or more accurately, the gate of FET $M_{N2}$ of the GBL interface circuit 440 keeps FET $M_{N2}$ turned off, thereby causing the drain of FET $M_{N2}$ to float or present relatively high impedance to the global bit line GBLM. This is done to prevent the LDP circuit 400 from interfering with the global bit line GBLM, while another LDP circuit accesses the global bit line GBLM during a memory access operation pertaining to a memory bank not coupled to LDP circuit 400.

After the precharge operation is complete, a memory access operation may be performed. Taking the example that data from a memory cell coupled to bit line BL-JM3 associated with the first memory bank is to be read and outputted to the global bit line GBLM, the select signal S3 is asserted in order to turn on FET $M_{NJ3}$ and couple bit line BL-JM3 to the output of the first multiplexer 410. The remaining select signals are not asserted so that only the selected bit line BL-JM3 is coupled to the output of the first multiplexer 410. The asserted select signal S3 also causes the second multiplexer 420 to couple the bit line BL-KM3 to its output. However, since the second memory bank is not selected (all of its word lines are not asserted), the precharge high logic level voltage at the output of the second multiplexer 420 is not affected.

In addition to asserting the select signal S3, the enable signal $\overline{\text{ENJ/K}}$ is asserted in order to turn on FET $M_{P3}$ and turn off FET $M_{N1}$. The turning on of FET $M_{P3}$ couples the positive voltage rail to the NAND gate 432 in order to power on the NAND gate 432. The turning off of FET $M_{N1}$ de-couples the output of the NAND gate 432 from ground, and allows the output to reach its proper logic level voltage based on the data being read.

At this point, the LDP circuit 400 is configured to output the data from bit line BL-JM3 to the global bit line GBLM. For instance, if the data on the BL-JM3 is at a low logic state, the precharged high logic state at the output of the first multiplexer 410 discharges via the selected bit line BL-JM3. This produces a low logic level at the first input of the NAND gate 432. Since the second input of the NAND gate 432 has been precharged to a high logic level, the NAND gate 432 generates a high logic level at its output. The high logic level, being applied to the gate of FET $M_{N2}$ of the GBL interface circuit 440, causes FET $M_{N2}$ to conduct. The conducting FET $M_{N2}$ causes the precharged high logic level on the global bit line GBLM to discharge to ground via FET $M_{N2}$. Thus, the data produced on the global bit line is a low logic level; the same as the data being read from the selected bit line BL-JM3.

If, on the other hand, the data on the selected bit line BL-JM3 is a high logic level, the high logic level does not cause the precharged high logic level at the output of the first multiplexer 410 to discharge through the selected bit line BL-JM3. Thus, the inputs to the NAND gate 432 are both at high logic levels. Accordingly, the NAND gate 432 outputs a low logic level. Thus, the FET $M_{N2}$ of the GBL interface circuit 440 remains off, and does not cause a discharge of the precharged high logic level on the global bit line GBLM. Thus, the data produced on the global bit line is a high logic level; the same as the data being read from the selected bit line BL-JM3.

The reading operation from the second memory bank via the second multiplexer 420 operates in a similar manner as the reading operation discussed above with respect to the first memory bank via the first multiplexer 410.

An advantage of the LDP circuit 400 is that the GBL interface circuit 440 includes a single device, e.g., FET $M_{N2}$ coupled to the global bit line GBLM. Accordingly, the capacitive loading of the global bit line GBLM by the LDP circuit 400 is essentially the drain capacitance of FET $M_{N2}$. Similarly, the resistive loading of the global bit line GBLM by the LDP circuit 400 is essentially the channel resistance of FET $M_{N2}$. As compared to LDP circuit 130-JM previously discussed, the capacitive and resistive loading of a global bit line by the LDP circuit 400 is substantially less than that of LDP circuit 130-JM. Again, the reduction in the capacitive and resistive loading of the global bit line GBLM improves the speed to which data may be placed on the global bit line GBLM.

Figure 5:
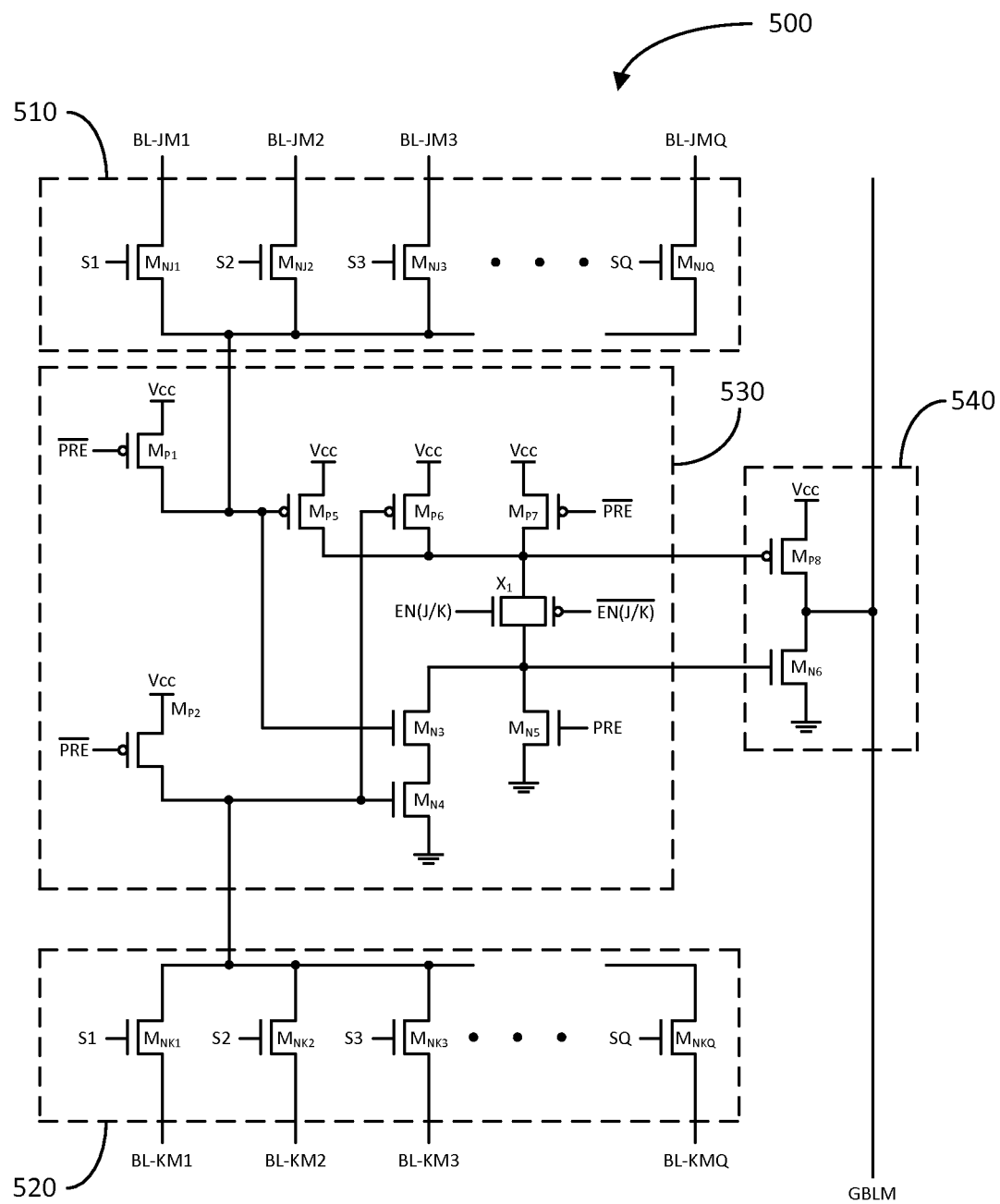
FIG. 5 illustrates a schematic diagram of another exemplary LDP circuit in accordance with another aspect of the disclosure.

FIG. 5 illustrates a schematic diagram of another exemplary LDP circuit 500 in accordance with another aspect of the disclosure. The LDP circuit 500 comprises a first multiplexer 510, a second multiplexer 520, a gating circuit 530, and a global bit line (GBL) interface circuit 540.

The first and second multiplexers 510 and 520 are similar to the first and second multiplexers 410 and 420 of LDP circuit 400. For instance, the first multiplexer 510 comprises a plurality of switching elements $M_{NJ1}$ to $M_{NJQ}$ coupled between respective bit lines BL-JM1 to BL-JMQ associated with a first memory bank, and an output of the first multiplexer 510. In this example, the switching elements $M_{NJ1}$ to $M_{NJQ}$ are configured as n-channel FETs, but may be configured as other types of devices. The FETs $M_{NJ1}$ to $M_{NJQ}$ include respective sources coupled to respective bit lines BL-JM1 to BL-JMQ, respective drains configured to receive select signals S1 to SQ, and respective drains coupled together to form the output of the first multiplexer 510.

Similarly, the second multiplexer 520 comprises a plurality of switching elements $M_{NK1}$ to $M_{NKQ}$ coupled between respective bit lines BL-KM1 to BL-KMQ associated with a second memory bank, and an output of the second multiplexer 510. In this example, the switching elements $M_{NK1}$ to $M_{NKQ}$ are configured as n-channel FETs, but may be configured as other types of devices. The FETs $M_{NK1}$ to $M_{NJKQ}$ include respective sources coupled to respective bit lines BL-KM1 to BL-KMQ, respective drains configured to receive select signals S1 to SQ, and respective drains coupled together to form the output of the second multiplexer 520.

The gating circuit 530 comprises a first precharge circuit including switching device $M_{P1}$ responsive to a precharge signal $\overline{\text{PRE}}$. In this example, the switching device $M_{P1}$ is configured as a p-channel FET comprising a source coupled to a positive voltage rail Vcc, a gate configured to receive the precharge signal $\overline{\text{PRE}}$, and a drain coupled to the output of the first multiplexer 510. It shall be understood that the switching device $M_{P1}$ may be configured as other types of devices. The gating circuit 530 further comprises a second precharge circuit including switching device $M_{P2}$ responsive to the precharge signal $\overline{\text{PRE}}$. In this example, the switching device $M_{P2}$ is also configured as a p-channel FET comprising a source coupled to the positive voltage rail Vcc, a gate configured to receive the precharge signal $\overline{\text{PRE}}$, and a drain coupled to the output of the second multiplexer 520. It shall be understood that the switching device $M_{P2}$ may be configured as other types of devices.

The gating circuit 530 further comprises a logic gate (e.g., a NAND gate) including switching elements $M_{P5}$, $M_{P6}$, $M_{N3}$, and $M_{N4}$. The switching elements $M_{P5}$ and $M_{P6}$ may be configured as p-channel FETs including respective sources coupled to the positive voltage rail Vcc, respective gates coupled to the outputs of the first and second multiplexers 510 and 520, and drains coupled together. It shall be understood that switching elements $M_{P5}$ and $M_{P6}$ may be configured as other types of devices. The switching elements $M_{N3}$ and $M_{N4}$ may be configured as n-channel FETs including respective gates coupled to the outputs of the first and second multiplexers 510 and 520. The source of switching device $M_{N3}$ is coupled to the drain of switching device $M_{N4}$, and the source of $M_{N4}$ is coupled to ground.

The gating circuit 530 comprises an enabling circuit for the NAND gate. The enabling circuit comprises switching devices $M_{P7}$, $X_1$, and $M_{N5}$. The switching device $M_{P7}$ may be configured as a p-channel FET including a source coupled to the positive voltage rail Vcc, a gate configured to receive the precharge signal $\overline{\text{PRE}}$, and a drain coupled to the drains of FETs $M_{P5}$ and $M_{P6}$. It shall be understood that the switching device $M_{P7}$ may be configured as other types of devices. The switching device $M_{N5}$ may be configured as an n-channel FET including a drain coupled to the drain of FET $M_{N3}$, a gate configured to receive the precharge signal PRE, and a source coupled to ground. It shall be understood that the switching device $M_{N5}$ may be configured as other types of devices.

The switching device $X_1$ may be configured as a transmission gate including a first terminal coupled to the drains of FETs $M_{P5}$, $M_{P6}$, and $M_{P5}$, a second terminal coupled to the drains of FETs $M_{N3}$ and $M_{N5}$, a control input configured to receive enable signal ENJ/K, and a control-not input configured to receive enable signal $\overline{ENJ/K}$. It shall be understood that the switching device $X_1$ may be configured as other types of devices.

The GBL interface circuit 540 comprises a single-stacked inverter including switching devices MP8 and MN6. The switching device $M_{P8}$ may be configured as a p-channel FET comprising a source coupled to the positive voltage rail Vcc, a gate coupled to the drains of FETs $M_{P5}$, $M_{P6}$, and $M_{P7}$ (as well as the first terminal of the transmission gate $X_1$), and a drain coupled to the global bit line GBLM. It shall be understood that the switching device $M_{P8}$ may be configured as other types of devices. The switching device $M_{N6}$ may be configured as a n-channel FET comprising a drain coupled to the drain of FET $M_{P8}$ and to the global bit line GBLM, a gate coupled to the drains of FETs $M_{N3}$ and $M_{N5}$ (as well as the second terminal of the transmission gate $X_1$), and a source coupled to ground. It shall be understood that the switching device $M_{N6}$ may be configured as other types of devices.

In operation, prior to a memory access operation, the precharge signal $\overline{PRE}$ is temporarily asserted (e.g., brought to a low logic level) to precharge the gates of FETs $M_{P5}$, $M_{P6}$, $M_{N3}$, and $M_{N4}$ to a high logic level. More specifically, the asserted precharge signal $\overline{PRE}$ causes FETs $M_{P1}$ and $M_{P2}$ to conduct, thereby coupling the positive voltage rail Vcc to the gates of FETs $M_{P5}$, $M_{P6}$, $M_{N3}$, and $M_{N4}$. The temporarily asserted precharge signal $\overline{PRE}$ also precharges the gate of FET $M_{P8}$ to a high logic level, and pre-discharges the gate of FET $M_{N6}$ to a low logic level. More specifically, the asserted precharge signal $\overline{PRE}$ causes FETs $M_{P5}$ and $M_{N5}$ to conduct, thereby coupling the positive voltage rail Vcc to the gate of FET $M_{P8}$, and ground to the gate of FET $M_{N6}$. Further, the enable signal $\overline{ENJ/K}$ is de-asserted to turn off the transmission gate $X_1$.

In this configuration, both FETs $M_{P8}$ and $M_{N6}$ of the GBL interface circuit 540 are not conducting. Thus, the output node (e.g., at the drains of FETs $M_{P8}$ and $M_{N6}$) is configured to float or present a substantial high impedance to the global bit line GBLM, since there is substantially no current path between the output node and Vcc or the output node and ground via the GBL interface circuit 540. This is done to prevent the LDP circuit 500 from interfering with the global bit line GBLM, while another LDP circuit accesses the global bit line GBLM during a memory access operation pertaining to a memory bank not coupled to LDP circuit 500. Once the gates of FETs $M_{P5}$, $M_{P6}$, $M_{N3}$, $M_{N4}$ and $M_{P8}$ are precharged to a high logic level, and the gate of FET $M_{N6}$ is pre-discharged to a low logic level, the precharge signal $\overline{PRE}$ may be de-asserted to turn off FETs $M_{P1}$, $M_{P2}$, $M_{P5}$, and $M_{N5}$. Also, prior to a memory access operation, the select signals S1-SQ are all in a de-asserted state to de-couple the bit lines BL-JM1-BL-JMQ and BL-KM1-BL-KMQ from the outputs of the first and second multiplexers 510 and 520, respectively.

After the precharge operation is complete, a memory access operation may be performed. Taking the example that data from a memory cell coupled to bit line BL-JM3 associated with the first memory bank is to be read and outputted to the global bit line GBLM, the select signal S3 is asserted in order to turn on FET $M_{NJ3}$ and couple bit line BL-JM3 to the output of the first multiplexer 510. The remaining select signals are not asserted so that only the selected bit line BL-JM3 is coupled to the output of the first multiplexer 510. The asserted select signal S3 also causes the second multiplexer 520 to couple the bit line BL-KM3 to its output. However, since the second memory bank is not selected (all of its word lines are not asserted), the precharge high logic level voltage at the output of the second multiplexer 520 is not affected.

In addition to asserting the select signal S3, the enable signal ENJ/K is asserted in order to turn on the transmission gate X1. The turning on of the transmission gate X1 couples the drains of FETs $M_{P5}$ and $M_{P6}$ to the drain of FET $M_{N3}$. This configures the FETs $M_{P5}$, $M_{P6}$, $M_{N3}$, and $M_{N4}$ into a NAND gate. The NAND gate includes a first input (gates of FETs $M_{P5}$ and $M_{N3}$) coupled to the output of the first multiplexer 510, a second input (gates of FETs $M_{P6}$ and $M_{N4}$) coupled to the output of the second multiplexer 520, and an output (drains of FETs $M_{P5}$, $M_{P6}$, and $M_{N3}$) coupled to the gates of FETs $M_{P8}$ and $M_{N6}$ of the GBL interface circuit 540.

At this point, the LDP circuit 500 is configured to output the data from bit line BL-JM3 to the global bit line GBLM. For instance, if the data on the BL-JM3 is at a low logic state, the precharged high logic state at the output of the first multiplexer 510 discharges via the selected bit line BL-JM3. This produces a low logic level at the gates of FETs $M_{P5}$ and $M_{N3}$. This low logic level causes FET $M_{P5}$ to conduct, thereby coupling the positive voltage rail Vcc to the gates of FETs $M_{P8}$ and $M_{N6}$. The low logic level also causes FET $M_{N3}$ to not conduct to prevent a short circuit therethrough. The positive voltage rail Vcc being applied to the gates of FETs $M_{P8}$ and $M_{N6}$ causes FET $M_{P8}$ to not conduct to prevent Vcc from being applied to the global bit line GBLM, and FET $M_{N6}$ to conduct to ground the global bit line GBLM. Thus, the data produced on the global bit line is at a low logic level; the same as the data being read from the selected bit line BL-JM3.

If, on the other hand, the data on the selected bit line BL-JM3 is at a high logic level, the high logic level does not cause the precharged high logic level at the output of the first multiplexer 510 to discharge through the selected bit line BL-JM3. Thus, the gates of FETs $M_{P5}$ and $M_{N3}$ remain at a high logic level. This high logic level causes FET $M_{P5}$ to not conduct, and causes FET $M_{N3}$ to conduct, thereby coupling ground to the gates of FETs $M_{P8}$ and $M_{N6}$. The low logic level or ground applied to the gates of FETs $M_{P8}$ and $M_{N6}$ causes FET $M_{P8}$ to conduct to apply Vcc to the global bit line GBLM, and FET $M_{N6}$ to not conduct to prevent a short circuit therethrough. Thus, the data produced on the global bit line is at a high logic level; the same as the data being read from the selected bit line BL-JM3.

The reading operation from the second memory bank via the second multiplexer 520 operates in a similar manner as the reading operation discussed above with respect to the first memory bank via the first multiplexer 510.

An advantage of the LDP circuit 500 is that the GBL interface circuit 540 includes a single-stacked inverter (e.g., devices $M_{P8}$ and $M_{N6}$) coupled to the global bit line GBLM. Accordingly, the capacitive loading of the global bit line GBLM by the LDP circuit 500 is essentially the sum of the drain capacitance of FETs $M_{P8}$ and $M_{N6}$. Similarly, the resistive loading of the global bit line GBLM by the LDP circuit 500 is essentially the paralleling of the channel resistances of FETs $M_{P8}$ and $M_{N6}$. As compared to LDP circuit 130-JM previously discussed, the capacitive and resistive loading of the global bit line GBLM by the LDP circuit 500 is substantially less than that of LDP circuit 130-JM. Again, the reduction in capacitive and resistive loading of the global bit line GBLM improves the speed to which data may be placed on the global bit line GBLM.

Figure 6:
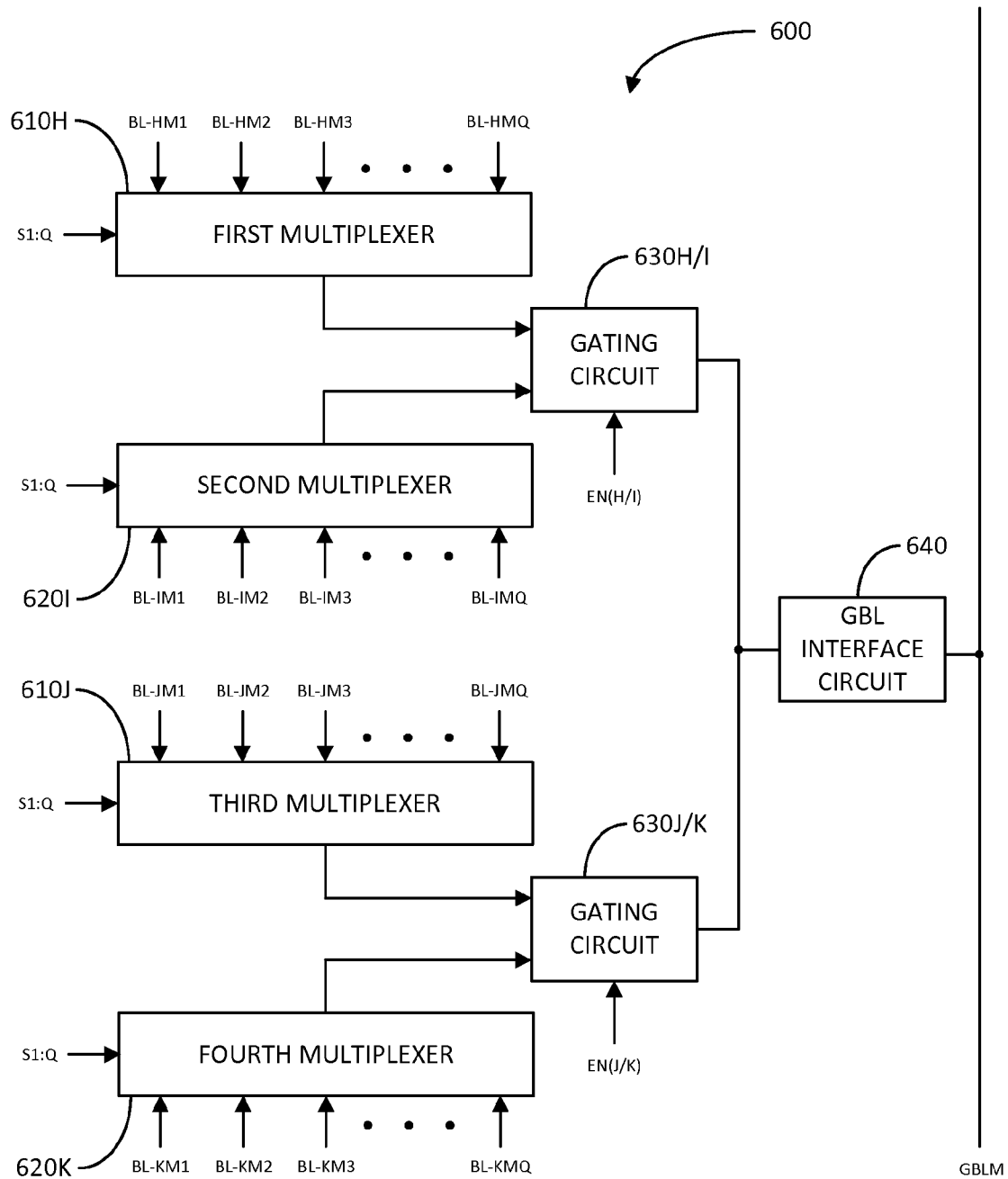
FIG. 6 illustrates a schematic diagram of another exemplary LDP circuit in accordance with another aspect of the disclosure.

FIG. 6 illustrates a block diagram of an exemplary local data path (LDP) circuit 600 that shares a single global bit line (GBL) interface circuit among a plurality of multiplexer/gating circuits in accordance with another aspect of the disclosure. Although, in this example, two multiplexer/gating circuits share a single GBL interface circuit, it shall be understood that more than two multiplexer/gating circuits may share a single GBL interface.

In particular, the LDP circuit 600 comprises a first multiplexer 610H, a second multiplexer 620I, and a gating circuit 630H/I. The first multiplexer 610H comprises inputs coupled to bit lines BL-HM1 to BL-HMQ of a first memory bank. The second multiplexer 620I comprises inputs coupled to bit lines BL-IM1 to BL-IMQ of a second memory bank. The first and second multiplexers 610H and 620I receive select signal S1:Q. The outputs of the first and second multiplexers 610H and 620I are coupled to inputs of the gating circuit 630H/I. The gating circuit 630H/I is enabled based on enable signal EN(H/I).

The LDP circuit 600 further comprises a third multiplexer 610J, a fourth multiplexer 620K, and a gating circuit 630J/K. The third multiplexer 610J comprises inputs coupled to bit lines BL-JM1 to BL-JMQ of a third memory bank. The fourth multiplexer 620K comprises inputs coupled to bit lines BL-KM1 to BL-KMQ of a fourth memory bank. The third and fourth multiplexers 610J and 620K receive select signal S1:Q. The outputs of the third and fourth multiplexers 610J and 620K are coupled to inputs of the gating circuit 630J/K. The gating circuit 630J/K is enabled based on enable signal EN(J/K).

The outputs of the gating circuits 630H/I and 630J/K are coupled to an input of a GBL interface circuit 640. The GBL interface 640, in turn, comprises an output coupled to a global bit line GBLM.

The LDP circuit 600 operates similar to that of the previous embodiments. In particular, if the first memory bank is to be read, the first multiplexer 610H couples a selected one of bit lines BL-HM1 to BL-HMQ to its output based on the select signal S1:Q. Accordingly, the data is transferred from the selected bit line to the input of the gating circuit 630H/I. The gating circuit 630H/I outputs the data based on an asserted state of the enable signal EN(H/I). The GBL interface circuit 640 puts the gated data on the global bit line GBLM. In this example, the enable signal EN(J/K) is not asserted to prevent the gating circuit 630J/K from interfering with the gating of data by gating circuit 630H/I. The reading operation for the other memory banks operates in a similar manner.

Figure 7:
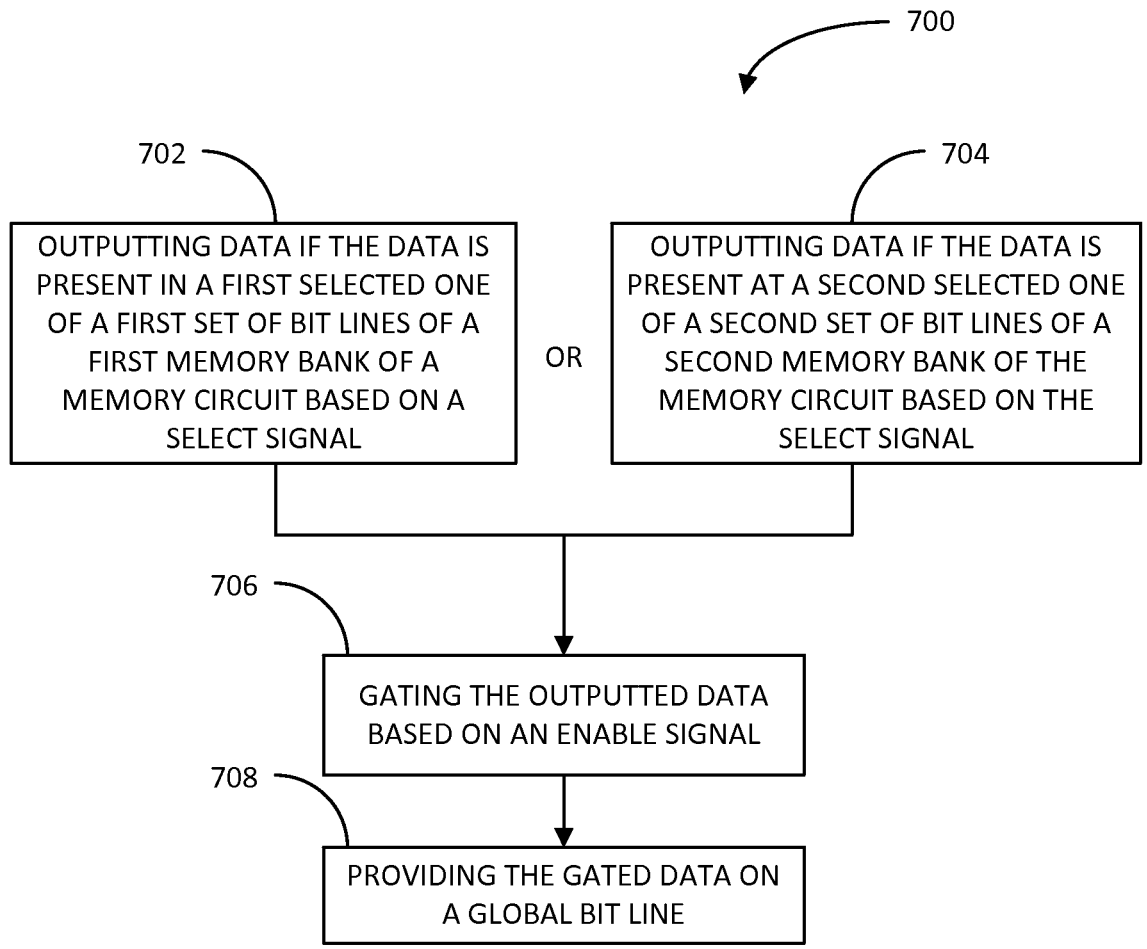
FIG. 7 illustrates a flow diagram of an exemplary method of reading data from a memory circuit in accordance with another aspect of the disclosure.

FIG. 7 illustrates a flow diagram of an exemplary method 600 of reading data from a memory circuit in accordance with another aspect of the disclosure. The method 700 comprises outputting data if the data is present at a first selected one of a first set of bit lines of a first memory bank of the memory circuit based on a select signal (block 702) or outputting data if the data is present at a second selected one of a second set of bit lines of a second memory bank of the memory circuit based on the select signal (block 704). Additionally, the method 700 comprises gating the outputted data based on an enable signal (block 706). And, the method 700 comprises providing the gated data on a global bit line (block 708).

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using another structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Also, it should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise a set of elements comprises one or more elements. In addition, terminology of the form "at least one of A, B, or C" or "one or more of A, B, or C" or "at least one of the group consisting of A, B, and C" used in the description or the claims means "A or B or C or any combination of these elements."

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

Those of skill in the art understand that information and signals may be represented using any of a variety of different technologies and techniques. For example, any data, instructions, commands, information, signals, bits, symbols, and chips referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the wireless node, all which may be accessed by the processor through the bus interface. Alternatively, or in addition, the machine-readable media, or any portion thereof, may be integrated into the processor, such as the case may be with cache and/or general register files.

A processing system may include hardware, software, firmware or any combination thereof. The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. In some aspects, a computer-readable medium comprises codes executable to perform one or more operations as taught herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the scope of the disclosure. Thus, the present disclosure is not intended to be limited to the aspects shown herein but is to be accorded the widest scope consistent with the principles and novel features disclosed herein.

What is claimed is:

1. An apparatus, comprising:
a first multiplexer configured to generate data at a first output from a first selected one of a first set of bit lines of a first memory bank based on a select signal, wherein the first multiplexer comprises a first set of switching elements for selectively coupling bit lines of the first set to the first output based on the select signal, wherein the switching elements of the first set comprise field effect transistors (FETs), and wherein gates of the FETs are configured to receive respective components of the select signal;
a second multiplexer configured to generate data at a second output from a second selected one of a second set of bit lines of a second memory bank based on the select signal;
a gating circuit configured to gate the data from either the first or second outputs based on an enable signal; and
an interface circuit configured to produce the gated data on a global bit line.

2. The apparatus of claim 1, wherein the second multiplexer comprises a second set of switching elements for selectively coupling bit lines of the second set to the second output based on the select signal.

3. The apparatus of claim 2, wherein the switching elements of the second set comprise field effect transistors (FETs), and wherein gates of the FETs of the second set are configured to receive respective components of the select signal.

4. The apparatus of claim 1, wherein the gating circuit is configured to:
gate the data from either the first or second output in response to an asserted state of the enable signal; and
generate a signal to configure the interface circuit to present a substantially high impedance to the global bit line in response to a de-asserted state of the enable signal.

5. The apparatus of claim 1, wherein the gating circuit comprises:
a first precharge circuit configured to precharge the first output of the first multiplexer to a high logic level voltage, wherein the high logic level voltage is discharged through the first selected one of the first set of bit lines in response to the data at the first selected one of the first set of bit lines being at a low logic level voltage; and
a second precharge circuit configured to precharge the second output of the second multiplexer to a high logic level voltage, wherein the high logic level voltage is discharged through the second selected one of the second set of bit lines in response to the data at the second selected one being at a low logic level voltage.

6. The apparatus of claim 1, wherein the gating circuit comprises a logic gate including first and second inputs respectively coupled to the first and second outputs of the first and second multiplexers, wherein the logic gate comprises an output at which the gated data is generated based on the enable signal.

7. The apparatus of claim 6, wherein the gating circuit further comprises a circuit for enabling the logic gate in response to the enable signal.

8. The apparatus of claim 7, wherein the enabling circuit comprises:
a first switching device configured to couple a first voltage rail to the logic gate in response to the enable signal being in an asserted state, and not couple the first voltage rail to the logic gate in response to the enable signal being in a de-asserted state; and
a second switching device configured to couple the output of the logic gate to a second voltage rail in response to the enable signal being in the de-asserted state, and not couple the output of the logic gate to the second voltage rail in response to the enable signal being in the asserted state.

9. The apparatus of claim 6, wherein the gating circuit further comprises a circuit configured to:
couple the output of the logic gate to the interface circuit in response to an asserted state of the enable signal; and generate a signal to configure the interface circuit to present a substantially high impedance to the global bit line in response to a de-asserted state of the enable signal.

10. The apparatus of claim 1, wherein the data gated by the gating circuit is in inverted logic, wherein the global bit line is precharged to a high logic level voltage, and wherein the interface circuit comprises a switching device configured to discharge the global bit line in response to the inverted-logic data gated by the gating circuit being at a high logic level voltage, and not discharge the global bit line in response to the inverted-logic data gated by the gating circuit being at a low logic level voltage or the enable signal being in a de-asserted state.

11. The apparatus of claim 1, wherein the data gated by the gating circuit is in inverted logic, and wherein the interface circuit comprises an inverter configured to invert and output the inverted-logic data from the gating circuit to the global bit line.

12. The apparatus of claim 11, wherein the inverter is configured to present substantially high impedance to the global bit line in response to the enable signal being in a de-asserted state.

13. The apparatus of claim 1, further comprising:
a third multiplexer configured to generate data at a third output from a third selected one of a third set of bit lines of a third memory bank based on the select signal;
a fourth multiplexer configured to generate data at a fourth output from a fourth selected one of a fourth set of bit lines of a fourth memory bank based on the select signal;
a second gating circuit configured to gate the data from either the third or fourth output based on a second enable signal, wherein the interface circuit is configured to produce the data gated by the second gating circuit on the global bit line.

14. A method of reading data from a memory circuit, comprising:
outputting data if the data is present at a first selected one of a first set of bit lines of a first memory bank of the memory circuit based on a select signal, wherein outputting data from the first selected one of the first set of bit lines comprises activating a first selected one of a first set of switching elements coupled to the first set of bit lines, respectively, wherein the switching elements of the first set comprise field effect transistors (FETs), and wherein gates of the FETs are configured to receive respective components of the select signal;
outputting data if the data is present at a second selected one of a second set of bit lines of a second memory bank of the memory circuit based on the select signal;
gating the outputted data based on an enable signal; and
producing the gated data on a global bit line.

15. The method of claim 14, wherein outputting data from the second selected one of the second set of bit lines comprises activating a second selected one of a second set of switching elements coupled to the second set of bit lines, respectively.

16. The method of claim 15, wherein the switching elements of the second set comprise field effect transistors (FETs), and wherein gates of the FETs of the second set are configured to receive respective components of the select signal.

17. The method of claim 14, wherein gating the outputted data comprises gating the outputted data in response to an asserted state of the enable signal; and further comprising producing a substantially high impedance to the global bit line in response to a de-asserted state of the enable signal.

18. The method of claim 14, wherein gating the outputted data comprises:
generating a first precharged high logic level voltage, wherein the first high logic level voltage is discharged through the first selected one of the first set of bit lines in response to the data at the first selected one of the first set of bit lines being at a low logic level voltage; and
generating a second precharged high logic level voltage, wherein the second precharged high logic level voltage is discharged through the second selected one of the second set of bit lines in response to the data at the second selected one being at a low logic level voltage.

19. The method of claim 14, wherein gating the outputted data comprises performing a logic operation to gate the one of the data.

20. The method of claim 19, further comprising enabling the performance of the logic operation is in response to the enable signal.

21. The method of claim 20, wherein enabling the performance of the logic operation comprises coupling a first voltage rail to a logic gate performing the logic operation and not coupling the output of the logic gate to a second voltage rail in response to the enable signal being in the asserted state; and
wherein disabling the performance of the logic operation comprises not coupling the first voltage rail to the logic gate and coupling the output of the logic gate to the second voltage rail in response to the enable signal being in the de-asserted state.

22. The method of claim 19, wherein gating the outputted data comprises:
coupling an output of a logic gate to an interface circuit responsible for producing the gated data on the global bit line in response to an asserted state of the enable signal; and
configuring the interface circuit to present a substantially high impedance to the global bit line in response to a de-asserted state of the enable signal.

23. The method of claim 14, wherein producing the gated data on the global bit line comprises:
precharging the global bit line to a high logic level voltage; and
discharging the precharged high logic level voltage on the global bit line in response to the gated data being at a low logic level voltage; or
not discharging the global bit line in response to the gated data being at a high logic level voltage level.

24. The method of claim 14, wherein the gated data is in inverted logic, and wherein producing the gated data onto the global bit line comprises inverting the gated data.

25. The method of claim 14, further comprising forming substantially high impedance to the global bit line in response to the enable signal being in a de-asserted state.

26. The method of claim 14, further comprising:
outputting data if the data is present at a third selected one of a third set of bit lines of a third memory bank of the memory circuit based on the select signal;
outputting data if the data is present at a fourth selected one of a fourth set of bit lines of a fourth memory bank of the memory circuit based on the select signal;
gating the outputted data from either the third or fourth memory bank based on a second enable signal; and
producing the gated data from either the third or fourth memory bank on the global bit line.

27. An apparatus, comprising:
first means for outputting data if the data is present at a first selected one of a first set of bit lines of a first memory bank based on a select signal, wherein the first outputting means comprises a first set of switching means for selectively coupling bit lines of the first set to a first output of the first outputting means based on the select signal, wherein the switching means of the first set comprise field effect transistors (FETs), and wherein gates of the FETs are configured to receive respective components of the first select signal;

second means for outputting data if the data is present at a second selected one of a second set of bit lines of a second memory bank based on the select signal;

means for gating the outputted data based on an enable signal; and means for producing the gated data on a global bit line.

28. The apparatus of claim 27, wherein the second outputting means comprises a second set of switching means for selectively coupling bit lines of the second set to a second output of the second selection means based on the select signal.

29. The apparatus of claim 28, wherein the switching means of the second set comprises field effect transistors (FETs), and wherein gates of the FETs of the second set are configured to receive respective components of the second select signal.

30. The apparatus of claim 27, wherein the gating means is configured to:
gate the outputted data in response to an asserted state of the enable signal; and
generate a signal to configure the means for producing gated data on the global bit line to present a substantially high impedance to the global bit line in response to a de-asserted state of the enable signal.

31. The apparatus of claim 27, wherein the gating means comprises:
a first means for generating a first precharged high logic level voltage, wherein the first precharged high logic level voltage is discharged through the first selected one of the first set of bit lines in response to the data at the first selected one of the first set of bit lines being at a low logic level voltage; and
a second means for generating a second precharged high logic level voltage, wherein the second precharged high logic level voltage is discharged through the second selected one of the second set of bit lines in response to the data at the second selected one being at a low logic level voltage.

32. The apparatus of claim 27, wherein the gating means comprises logic means including first and second inputs respectively coupled to the first and second outputting means, wherein the logic means comprises an output at which the gated data is generated based on the enable signal.

33. The apparatus of claim 32, wherein the gating means further comprises a means for enabling the logic means in response to the enable signal.

34. The apparatus of claim 33, wherein the enabling means comprises:
a first switching means configured to couple a first voltage rail to the logic means in response to the enable signal being in an asserted state, and not couple the first voltage rail to the logic means in response to the enable signal being in a de-asserted state; and
a second switching means configured to couple the output of the logic means to a second voltage rail in response to the enable signal being in the de-asserted state, and not couple the output of the logic means to the second voltage rail in response to the enable signal being in the asserted state.

35. The apparatus of claim 32, wherein the gating means further comprises:
means for coupling the logic means to the producing means in response to an asserted state of the enable signal; and
means for configuring the producing means to present a substantially high impedance to the global bit line in response to a de-asserted state of the enable signal.

36. The apparatus of claim 27, wherein the data outputted by the gating means is in inverted logic, wherein the global bit line is precharged to a high logic level voltage, and wherein the producing means comprises a switching means configured to discharge the global bit line in response to the inverted-logic data outputted by the gating means being at a high logic level voltage, and not discharge the global bit line in response to the inverted-logic data outputted by the gating means being at a low logic level voltage or the enable signal being in a de-asserted state.

37. The apparatus of claim 27, wherein the data outputted by the gating means is in inverted logic, and wherein the producing means comprises means for inverting the inverted-logic data from the gating means.

38. The apparatus of claim 37, wherein the inverting means is configured to present substantially high impedance to the global bit line in response to the enable signal being in a de-asserted state.

39. The apparatus of claim 27, further comprising:
third means for outputting data if the data is present at a third selected one of a third set of bit lines of a third memory bank of the memory circuit based on the select signal;
fourth means for outputting data if the data is present at a fourth selected one of a fourth set of bit lines of a fourth memory bank of the memory circuit based on the select signal;
second means for gating the outputted data from either the third or fourth memory bank based on a second enable signal, and wherein the producing means is configured to produce the gated data from the second gating means on the global bit line.

* * * * *